(12) United States Patent
Grinstead et al.

(10) Patent No.: US 8,378,680 B2
(45) Date of Patent: Feb. 19, 2013

(54) SYSTEM FOR CONCURRENT ACQUISITION OF MR ANATOMICAL BRAIN IMAGES AND MR ANGIOGRAMS WITHOUT CONTRAST-INJECTION

(75) Inventors: John William Grinstead, Portland, OR (US); Gerhard Laub, Burlingame, CA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 396 days.

(21) Appl. No.: 12/886,617

(22) Filed: Sep. 21, 2010

(65) Prior Publication Data

US 2011/0181283 A1 Jul. 28, 2011

Related U.S. Application Data

(60) Provisional application No. 61/298,965, filed on Jan. 28, 2010.

(51) Int. Cl.
*G01V 3/00* (2006.01)

(52) U.S. Cl. ........................ 324/309

(58) Field of Classification Search .......... 324/300–322
See application file for complete search history.

(56) References Cited

U.S. PATENT DOCUMENTS

| | | | |
|---|---|---|---|
| 5,560,360 A * | 10/1996 | Filler et al. ................ | 600/408 |
| 6,564,080 B1 * | 5/2003 | Kimura ...................... | 600/410 |
| 7,369,887 B2 * | 5/2008 | Fayad et al. ................ | 600/413 |
| 8,030,919 B2 * | 10/2011 | Duerk et al. ............... | 324/306 |
| 8,125,222 B2 * | 2/2012 | Sugiura ...................... | 324/307 |
| 2008/0161678 A1 | 7/2008 | Miyazaki et al. | |
| 2009/0143666 A1 | 6/2009 | Edelman et al. | |
| 2010/0014735 A1 | 1/2010 | Bi et al. | |
| 2010/0198053 A1 | 8/2010 | Miyazaki et al. | |

OTHER PUBLICATIONS

Rooney et al., "Magnetic Field and Tissue Dependencies of Human Brain Longitudinal 1H2O Relaxation in Vivo", Magnetic Resonance in Medicine 57:308-318 (2007).
Zwanenburg, et al., "MR Angiography of the Cerebral Perforating Arteries With Magnetization Prepared Anatomical Reference at 7T: Comparison With Time-of-Flight", Journal of Magnetic Resonance Imaging, 28: 1519-1526 (2008).
Maderwald, et al., "To TOF or not to TOF: strategies for non-contrast-enhanced intracranial MRA at 7 T", Magn Reson Mater Phy, Research Article, Nov. 22, 2007.
J. Grinstead et al., The Origins of Bright Blood MPrage AT 7 Tesla and a Simultaneous Method for T1 Imaging and Non-Contrast MRA, Poster, Siemens Healthcare, Portland, Oregon, US.

* cited by examiner

*Primary Examiner* — Dixomara Vargas
(74) *Attorney, Agent, or Firm* — Alexander J Burke

(57) ABSTRACT

An MR imaging system without the use of a contrast agent, in a first repetition time interval, generates a non-selective magnetization preparation pulse for magnetizing an anatomical volume encompassing blood flowing into a selected slab within the volume for blood signal suppression, generates RF excitation pulses and acquires a first MR imaging dataset of the selected slab within the volume with a suppressed blood signal. The system in a second repetition time interval succeeding the first repetition time interval, generates a selected slab magnetization preparation pulse for magnetizing the selected slab, generates RF excitation pulses and acquires a second MR imaging dataset of the selected slab within the volume. An image data processor substantially subtracts imaging data of the first MR imaging dataset from the second MR imaging dataset to provide an image enhancing a vessel structure in the selected slab and also substantially averages imaging data to provide an MR anatomical image.

20 Claims, 6 Drawing Sheets

US 8,378,680 B2

SYSTEM FOR CONCURRENT ACQUISITION OF MR ANATOMICAL BRAIN IMAGES AND MR ANGIOGRAMS WITHOUT CONTRAST-INJECTION

This is a non-provisional application of provisional application Ser. No. 61/298,965 filed 28 Jan., 2010, by J. W. Grinstead et al.

FIELD OF THE INVENTION

This invention concerns a system for concurrent acquisition of an MR anatomical image of an anatomical region of interest and an MR angiogram image of a vessel structure in the region of interest without the use of a contrast agent.

BACKGROUND OF THE INVENTION

Magnetization Prepared Rapid Gradient Echo (MPRAGE) is a widely used pulse sequence for 3D T1-weighted anatomical MRI imaging using an inversion recovery (IR) pulse followed by a rapid gradient echo readout. Unlike at lower field strengths, it has been reported that the blood appears extremely bright using MPRAGE MR imaging at 7 Tesla, and provides excellent vascular information but there is a lack of an understanding and explanation for this effect. Also it is known to optimize MPRAGE parameters to maximize the amount of blood inflow enhancement and background tissue suppression, at the expense of T1-weighted anatomical image quality. A system according to invention principles provides concurrent MR imaging and non-contrast angiography with excellent background suppression based on principles derived from analysis and determination of the primary source of bright blood using MPRAGE at 7 Tesla.

SUMMARY OF THE INVENTION

A System according to invention principles adaptively controls Inversion-Recovery Slab-Selectivity in an MRI scanner with RF (radio frequency) transmit coils covering a substantial anatomical region outside of a selected slab (e.g. a Whole-Body RF Transmit Coil) for concurrent acquisition of T1-weighted anatomical brain images and MR angiograms without contrast-injection. An MR imaging system provides concurrent acquisition of an MR anatomical image of an anatomical region of interest and an MR angiogram image of a vessel structure in the region of interest without the use of a contrast agent. The system in a first repetition time interval, generates a non-selective magnetization preparation pulse for magnetizing an anatomical volume encompassing blood flowing into a selected slab within the volume for blood signal suppression, generates RF excitation pulses and acquires a first MR imaging dataset of the selected slab within the volume with a suppressed blood signal. The system in a second repetition time interval succeeding the first repetition time interval, generates a selected slab magnetization preparation pulse for magnetizing the selected slab, generates RF excitation pulses and acquires a second MR imaging dataset of the selected slab within the volume. An image data processor substantially subtracts imaging data of the first MR imaging dataset from the second MR imaging dataset to provide an image enhancing a vessel structure in the selected slab. The image data processor substantially averages imaging data of the first MR imaging dataset and the second MR imaging dataset to provide an MR anatomical image of an anatomical region of interest.

DETAILED DESCRIPTION OF THE INVENTION

Definitions

Adiabatic radiofrequency (RF) pulses are a special class of MR RF pulse that is more robust against a spatially non-uniform B1 field (the transmit RF field). The term "adiabatic" refers to the "adiabatic condition", which is a mathematical limit the RF pulse needs to operate within to operate correctly.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted). Adiabatic IR pulses are used to give more uniform contrast throughout an imaging volume than non-adiabatic RF pulses.

iPAT (integrated Parallel Acquisition Techniques) comprises "parallel imaging". It enables faster scanning through reduced phase encoding and addition of RF coil information. An iPAT factor of 2 enables scanning about twice as fast, iPAT factor of 3 enables scanning about three times as fast and so on.

TI=inversion time, the time between an inversion recovery pulse and the next RF excitation pulse. TI determines the image contrast.

TR=repetition time, the time between successive RF excitation pulses.

FA=flip angle, i.e., an RF flip angle. For an inversion pulses, FA=180 degrees.

A system adaptively controls Inversion-Recovery Slab-Selectivity in a Scanner with RF transmit coils covering a substantial anatomical region outside of a selected slab (e.g. a Whole-Body RF Transmit Coil) for concurrent acquisition of T1-weighted anatomical brain images and MR angiograms without contrast-injection. Other different types of image contrast may alternatively be used to derive a subtraction angiogram depending on type of magnetization preparation (inversion recovery, saturation recovery, or other types of preparation modules), TI and readout (i.e. gradient echo or spin echo), and the system is not constrained to use just T1 weighted images. The system advantageously provides MR angiograms without contrast-injection by adaptive control of inversion-recovery slab-selectivity.

Figure 1:
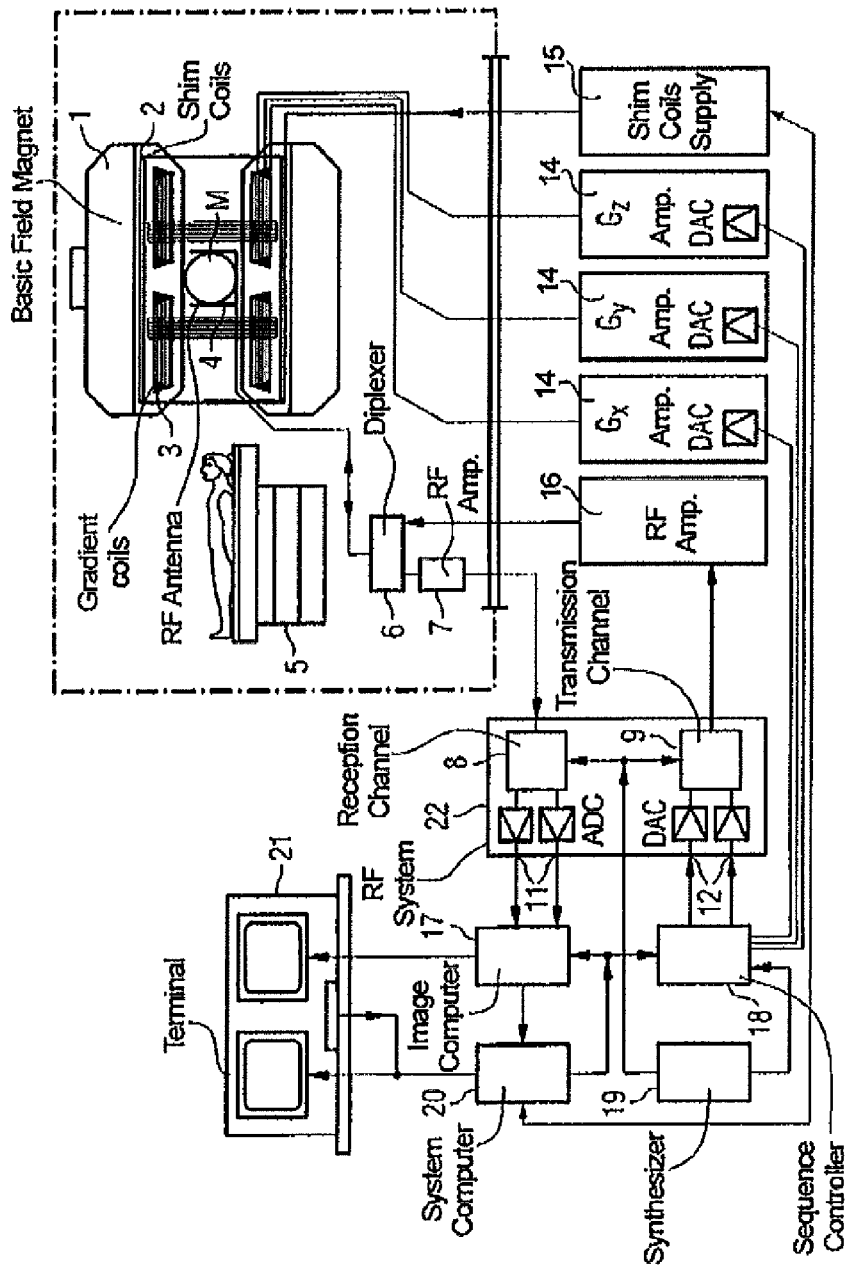
FIG. 1 shows an MR imaging system that provides concurrent acquisition of an MR anatomical image of an anatomical region of interest and an MR angiogram image of a vessel structure in the region of interest without the use of a contrast agent, according to invention principles.

FIG. 1 shows MR imaging system 10 that provides concurrent acquisition of an MR anatomical image of an anatomical region of interest and an MR angiogram image of a vessel structure in the region of interest without the use of a contrast agent. System 10 concurrently acquires T1-Weighted Anatomical Brain Images and MR Angiograms without Contrast-Injection, for example. The system in one embodiment employs controlled Inversion-Recovery Slab-Selectivity in MR image Scanners with Whole-Body RF Transmit Coils. An adiabatic inversion pulse in MPRAGE is optimized to give uniform inversion in the presence of B1 (magnetic field) inhomogeneity. Slab-selectivity is not required for good image quality, so it is common to use non-selective IR pulses. Slice-selective adiabatic IR pulses for 2D imaging (i.e. FLAIR—Fluid attenuation inversion recovery) do not give good slab-selectivity if extended to a large 3D slab-thickness, because of the resulting weak slab-selective gradient. So in practice, IR pulses in MPRAGE are usually effectively non-selective. Advantageously, however, if the reference gradient used for the adiabatic IR pulse is increased, the slab-selectivity is substantially improved. System 10 in one embodiment advantageously uses an MPRAGE pulse sequence with such an optimized slab-selective IR pulse. Experiments were performed at 3 and 7 Tesla using a Siemens Trio and Tim System and MAGNETOM 7 T system with identical protocols being run on each system, as well as protocols using the TI/TR/FA that provide optimal MPRAGE anatomical image quality. RF coils used comprise 3 T CP birdcage transmit-receive (Tx-Rx) head coil, 3 T 12-channel phased array Rx-only head coil (Siemens) and 7 T 8-channel phased array Tx-Rx head coil (Rapid).

A high quality MPRAGE protocol used for structural imaging (1 mm isotropic voxels, 10 minute scan time) is modified to run in approximately half the time using parallel imaging with an acceleration factor of 2. Measurements performed include, use of a non-selective IR pulse and another with the improved slab-selective IR pulse. The two measurements are averaged to restore the SNR of the original longer scan without iPAT, for use in high quality structural imaging. The two measurements are also subtracted to yield an image of only the inflowing blood with the stationary tissue suppressed.

The inventors have advantageously recognized that increased blood brightness using an MPRAGE protocol at higher static magnetic fields (e.g., 7 Tesla) is not due to longer blood T1 at higher field strength since this would have the opposite effect, because the longer the T1 the quicker the blood saturates during the gradient echo readout and the slower the longitudinal magnetization is to recover for a given TR. The purpose of using gadolinium-based contrast agents for angiography is to decrease the T1 of blood so that it does not saturate as quickly to make blood brighter, which is contrary to the idea that a longer T1 at 7 T explains bright blood in an MPRAGE pulse sequence.

The inventors have advantageously recognized that a major difference between research 7T scanners and clinical 3T scanners is the lack of body RF transmit coils at 7 T, while at 3 T it is most common to use a body RF coil for transmit and a local receive-only head array coil for signal reception. At 3 T, a non-selective IR pulse is transmitted by the body coil and inverts blood far outside the imaging volume, including the neck, aorta, and even the heart. At 7 T, a non-selective IR pulse is transmitted by a head coil and is only able to invert blood within reach of this local coil. Typically, 7 T head coils do not reach inferior to the cerebellum. This means that with a Tx-Rx head coil, a non-selective IR pulse is effectively a slab-selective IR pulse.

In system 10 a basic field magnet 1 generates a strong magnetic field, which is constant in time, for the polarization or alignment of the nuclear spins in the examination region of an object, such as, for example, a part of a human body to be examined. The high homogeneity of the basic magnetic field required for the magnetic resonance measurement is provided in a spherical measurement volume M, for example, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a shim-current supply 15.

In the basic magnetic field 1, a cylinder-shaped gradient coil system 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times.

Within the gradient field system 3, radio-frequency (RF) coils 4 are located which convert the radio-frequency pulses emitted by a radio-frequency power amplifier 16 via multiplexer 6 into a magnetic alternating field in order to excite the nuclei and align the nuclear spins of the object to be examined or the region of the object to be examined. In one embodiment, RF coils 4 comprise a subset or substantially all of multiple RF coils arranged in sections along the length of volume M corresponding to the length of a patient. Further, an individual section RF coil of coils 4 comprises multiple RF coils providing RF image data that is used in parallel to generate a single MR image. RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the processing nuclear spins, are converted into a voltage that is supplied via an amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M.

The conversion from transmitting to receiving operation is done via a multiplexer 6. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens. System 10 uses magnetic field gradients and radio frequency excitation to create an image. System computer 20 translates acquired k-space data onto a Cartesian grid and a Three-Dimensional Fourier Transform (3DFT) method is used to process the data to form a final image. K-space is the temporary image space in which data from digitized MR signals is stored during data acquisition and comprises raw data in a spatial frequency domain before reconstruction. When k-space is full (at the end of an MR scan), the data is mathematically processed to produce a final image.

Figure 5:
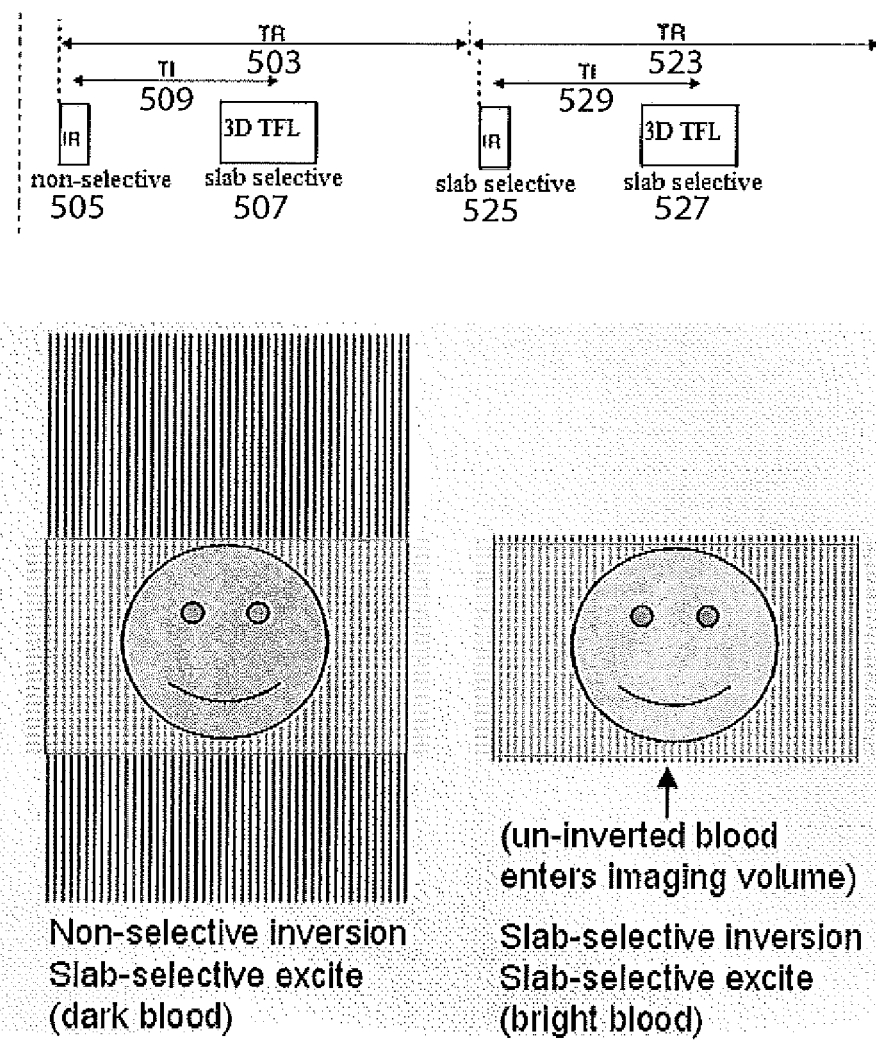
FIG. 5 shows a pulse sequence providing concurrent acquisition of an MR anatomical image of an anatomical region of interest and an MR angiogram image of a vessel structure in the region of interest without the use of a contrast agent, according to invention principles.

System computer 20 automatically (or in response to user command entered via terminal 21) employs and directs the MR imaging device of system 10 in concurrently acquiring an MR anatomical image of an anatomical region of interest and an MR angiogram image of a vessel structure in the region of interest without the use of a contrast agent. FIG. 5 shows a pulse sequence providing concurrent acquisition of an MR anatomical image of an anatomical region of interest and an MR angiogram image of a vessel structure in the region of interest without the use of a contrast agent. MR imaging system 10, in first repetition time interval TR 503 (FIG. 5), generates non-selective magnetization preparation (e.g., IR) pulse 505 for magnetizing an anatomical volume encompassing blood flowing into a selected slab within the volume for blood signal suppression, generates RF excitation pulses 507 at inversion time (TI) 509 using RF system 22 and acquires a first MR imaging dataset of the selected slab within the volume with a suppressed blood signal. The first repetition time interval 503 comprises non-selective inversion and slab selective RF excitation with substantially dark (suppressed) blood.

In second repetition time interval 523 succeeding the first repetition time interval 503, system 10 generates a selected slab magnetization preparation (e.g., IR) pulse 525 for magnetizing the selected slab, generates RF excitation pulses 527 at inversion time (TI) 529 using RF system 22 and acquires a second MR imaging dataset of the selected slab within the volume. The second repetition time interval 523 comprises slab-selective inversion and slab selective RF excitation with un-inverted blood entering the slab appearing as bright blood. An image data processor in system computer 20 substantially subtracts imaging data of the first MR imaging dataset from the second MR imaging dataset to provide an image enhancing a vessel structure in the selected slab.

Figure 2:
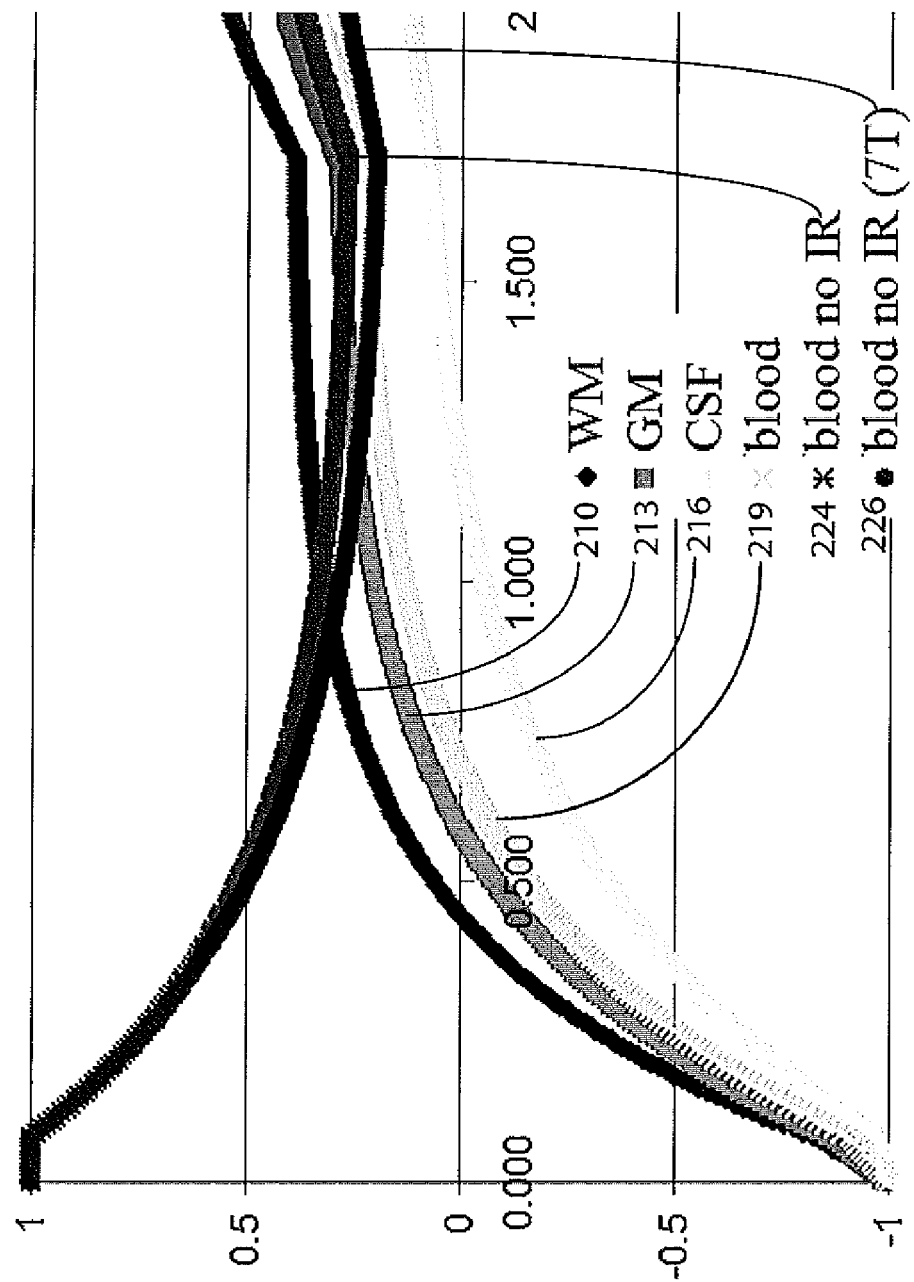
FIG. 2 shows a numerical simulation of signal values during an MPRAGE gradient echo readout for typical T1 values at 3 Tesla (and one curve at 7 Tesla) with and without an IR pulse, according to invention principles.

FIG. 2 shows a numerical simulation of signal values performed by system 10 (FIG. 1) during an MPRAGE gradient echo readout for typical T1 values at 3 Tesla (and one curve at 7 Tesla) with and without an IR pulse. The simulations of the MPRAGE pulse sequence using a 3 T magnetic field support comparison of signal levels against time of gray matter (GM 213), white matter (WM 210), Cerebral Spinal Fluid (CSF 216), and blood 219 as well as blood 224 acquired without use of IR pulses. In addition, curve 226 shows signal level of blood over time acquired without use of IR pulses and using a 7 T magnetic field. The T1 values for the simulation were predetermined using known data. The blood signal brightness is between CSF 216 (dark on T1 weighted images) and GM 213. However, if the blood does not experience an IR pulse, it is brighter for most of the readout. It can also be seen that the blood signal saturates slightly faster at 7 T, as expected because of the longer T1.

Using a Tx-Rx head coil to acquire images at 3 T, instead of the more common Rx-only head coil, results in blood with substantially increased brightness throughout the head which is similar to what is typically seen at 7 T where Tx-Rx head coils are the norm. If the Tx-Rx RF coil has a relatively large RF field that extends significantly beyond the imaging slab, some of the inflowing blood immediately inferior to the imaging slab may still become suppressed, leading to less bright blood at the superior end of the imaging slab. However, the use of the optimized slab-selective IR pulse in System 10 ensures the blood signal outside the imaging slab is not suppressed regardless of the extent of the RF field of the coil, so that the blood signal can become as bright at 3 T as at 7 T.

Figure 3:
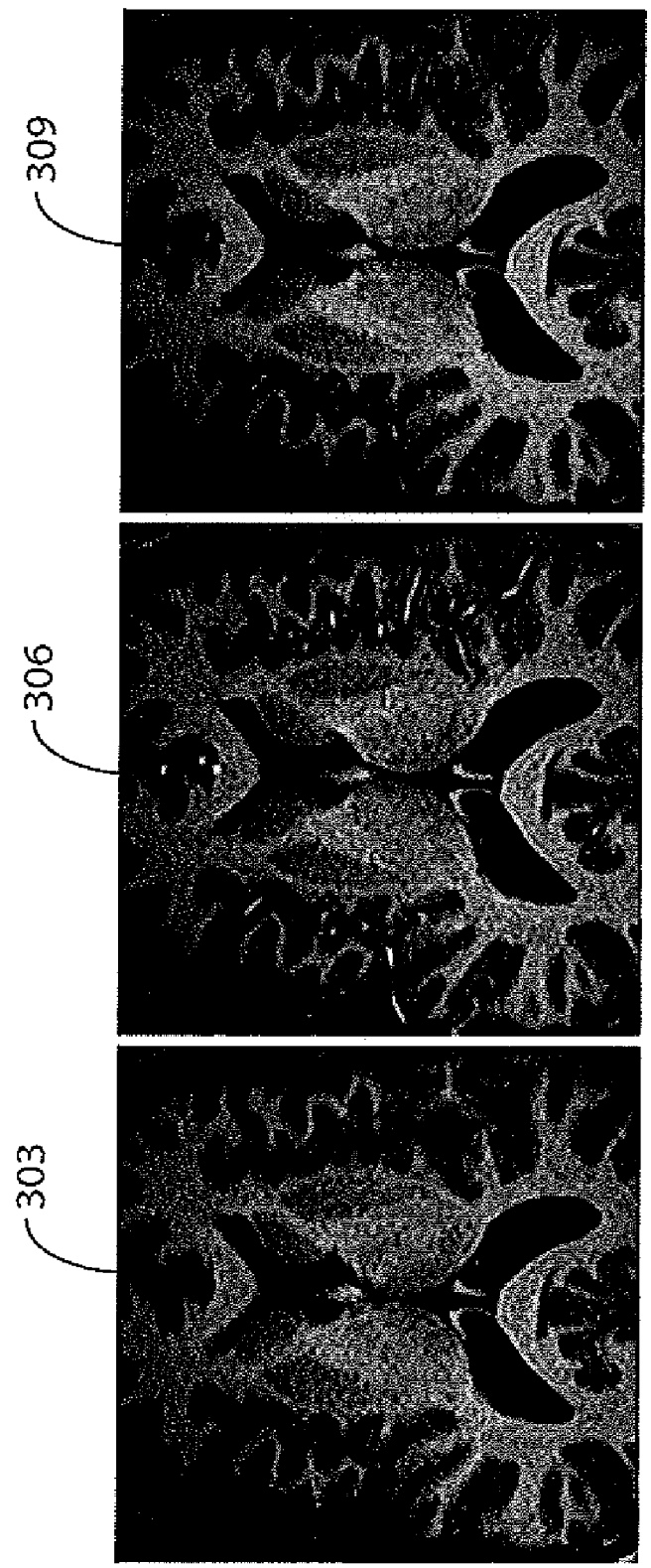
FIG. 3 shows an axial slice near the midbrain using a 3 T Rx-only (receive-only) head coil, using the non-selective and the improved slab-selective IR pulses. The average of the two images is also shown, demonstrating a high SNR anatomical image, according to invention principles.
Figure 4:
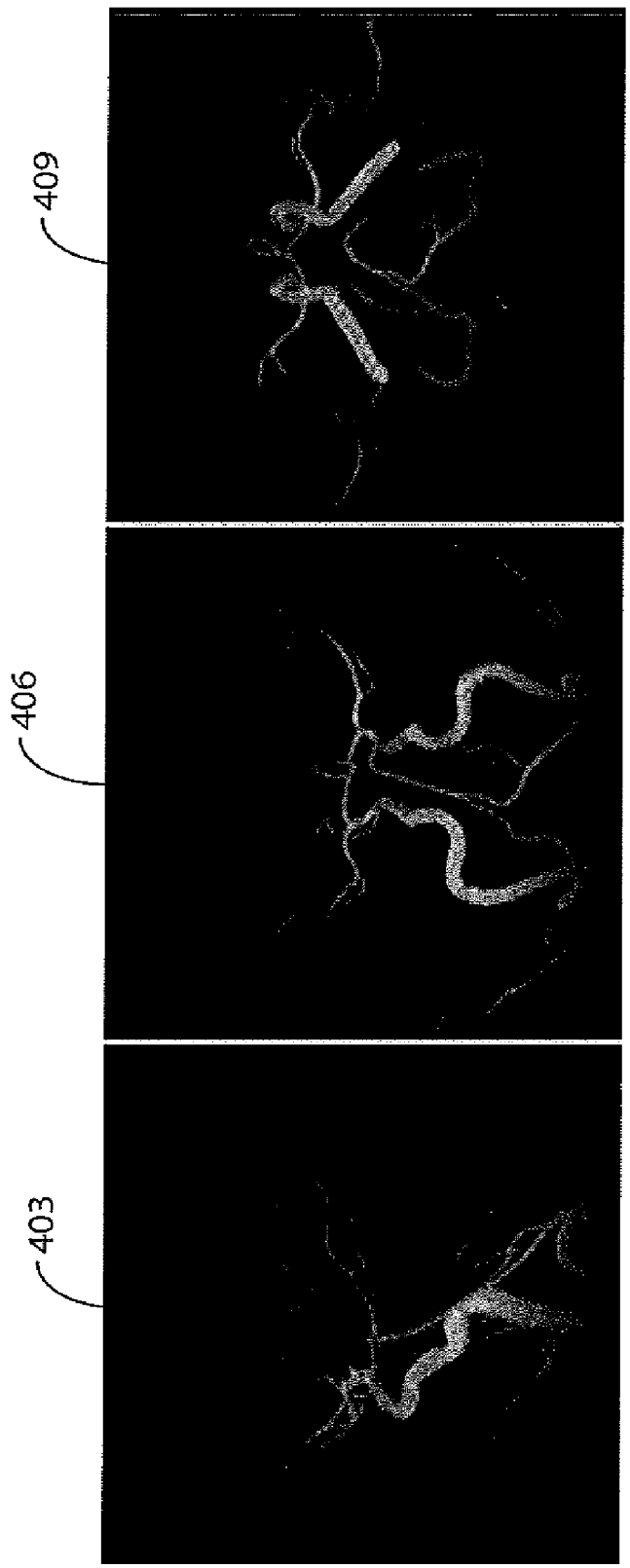
FIG. 4 shows sagittal, coronal, and axial maximum intensity projections as difference images with excellent vessel enhancement and background suppression, according to invention principles.

FIG. 3 shows an axial slice near the midbrain using a 3 T Rx-only head coil, using non-selective and the improved slab-selective IR pulses. The average of the two images is also shown, demonstrating a high SNR anatomical image. Image 303 shows a zoomed axial slice at midbrain level acquired using a non-selective IR pulse, image 306 shows the same zoomed axial slice at midbrain level acquired using the improved slab-selective IR pulse and image 309 shows the average (mean) of images 303 and 306 demonstrating a high SNR anatomical image. FIG. 4 shows sagittal MIP (Maximum Intensity Projection) image 403, coronal MIP image 406 and axial MIP image 409 comprising maximum intensity projections of the difference images with excellent vessel enhancement and background suppression. The images are generated by the image data processor in computer 20 (FIG. 1) by subtracting imaging data of a first MR imaging dataset from a second MR imaging dataset to provide an image enhancing a vessel structure and suppressing background detail in a selected slab. The first and second MR imaging datasets are acquired using a non-selective magnetization preparation pulse with a suppressed blood signal and a slab selective magnetization preparation pulse without a suppressed blood signal, respectively, as previously described in connection with FIG. 1. There is no blood signal loss in the vertebral arteries as often exhibited in known (e.g., time-of-flight) MR imaging scans because here vessel enhancement is due primarily to inflow of un-inverted blood signal. Consequently, system 10 (FIG. 1) concurrently yields high-quality T1 images and demonstrates non-contrast angiography at 3 T using a pulse sequence advantageously derived in response to inventor identification of the primary source of bright blood in images acquired using an MPRAGE imaging protocol at 7 T.

In an alternative embodiment, slab-selective and non-selective inversion recovery pulses are acquired in an interleaved manner, every other TR. The resulting angiographic image subtraction has less sensitivity to long term bulk motion than acquiring a complete first MR signal dataset with slab-selective inversion followed by a complete second measurement with non-selective inversion. An additional slab-selective inversion pulse (or saturation pulse) may be employed inferiorly to the imaging slab just prior to the gradient echo readout to prevent bright un-inverted blood that was missed by the initial non-selective IR pulse (i.e. the dark-blood measurement) from entering the imaging volume, which is possible in cases of very high flow rates, or limited RF coil coverage. This prevents inferior slices from not being completely dark on a non-selective IR (dark-blood) MR signal acquisition.

In an alternative embodiment, System 10 (FIG. 1) may employ a centric k-space reordering in a gradient echo acquisition to advantageously reduce the amount of saturation of inflowing un-inverted (bright) blood. This gives a higher blood signal in the subtracted angiogram, and reduces potential signal loss, especially at the superior side of the brain where the blood experiences a high number of RF pulses. A keyholed or partial Fourier acquisition is acquired in one embodiment where only a portion of k-space is acquired with the slab-selective IR (bright blood) and subsequently subtracted, providing a reduction in scan time with a controlled amount of angiogram resolution loss. Complex subtraction and addition of the separate measurements is performed to mitigate phase cancellation that may occur with pure magnitude image subtraction and addition. In one embodiment, the acquisition is split up into multiple slabs (as in multi-slab time-of-flight MRA). Further, a 2D or 3D excitation pulse is used to selectively invert the blood in specific arteries, for example inverting only the left carotid artery, in order to visualize blood transport deficits in each hemisphere of the brain.

Known pulse sequences such as Native TrueFISP fail to provide a subtraction of the separate bright-blood and dark-blood scans to cancel a background tissue. Native TrueFISP does not provide anatomical contrast (i.e. grey matter and white matter), because the background tissue (grey matter & white matter) has been suppressed by an IR pulse, in contrast to the system 10 pulse sequence. Further, the system 10 pulse sequence provides improved and increased uniform background tissue signal suppression than Native TrueFISP, because the white matter and grey matter contrast is substantially identical between two subtracted image MR dataset acquisitions. This provides uniform background tissue suppression after subtraction. In Native TrueFISP, an IR pulse is used for background tissue suppression, but this is sub-optimal for multiple types of tissue as grey matter and white matter have different T1, for example, requiring different TI to be well suppressed, so some tissue typically has a residual signal that may obscure an angiogram MIP (Maximum Intensity Projection). Native TrueFISP gives an image of blood vessels and fails to provide an image of soft tissue, because it is suppressed by an IR pulse. In contrast system 10 provides both.

The system advantageously uses inversion pulses to control blood signal brightness allowing a subtraction that gives image data substantially exclusively representing the blood vessels. Known methods use inversion pulses for stationary background tissue suppression in a time-of-flight angiogram pulse sequence which does not provide image contrast for different types of anatomical tissue. Whereas the system advantageously adaptively controls IR slab selectivity and performs a subtraction of two acquired image datasets to provide an angiographic image and performs an averaging of the two acquired image datasets to provide an averaged dataset showing a higher signal-to-noise ratio MR image of different types of tissue. The system advantageously produces two separate bright-blood and dark-blood MPRAGE image data acquisitions which are subtracted to suppress stationary background tissue and averaged to provide a high contrast image. MR angiography is used to suppress stationary background signal so that a maximum intensity projection (MIP) can be calculated to make an angiogram easier to read. The system concurrently provides both a subtracted angiogram and an averaged anatomical Ti-weighted image (the MPRAGE showing white matter and gray matter), which allows typical neuro exams to also have a high quality angiogram.

Figure 6:
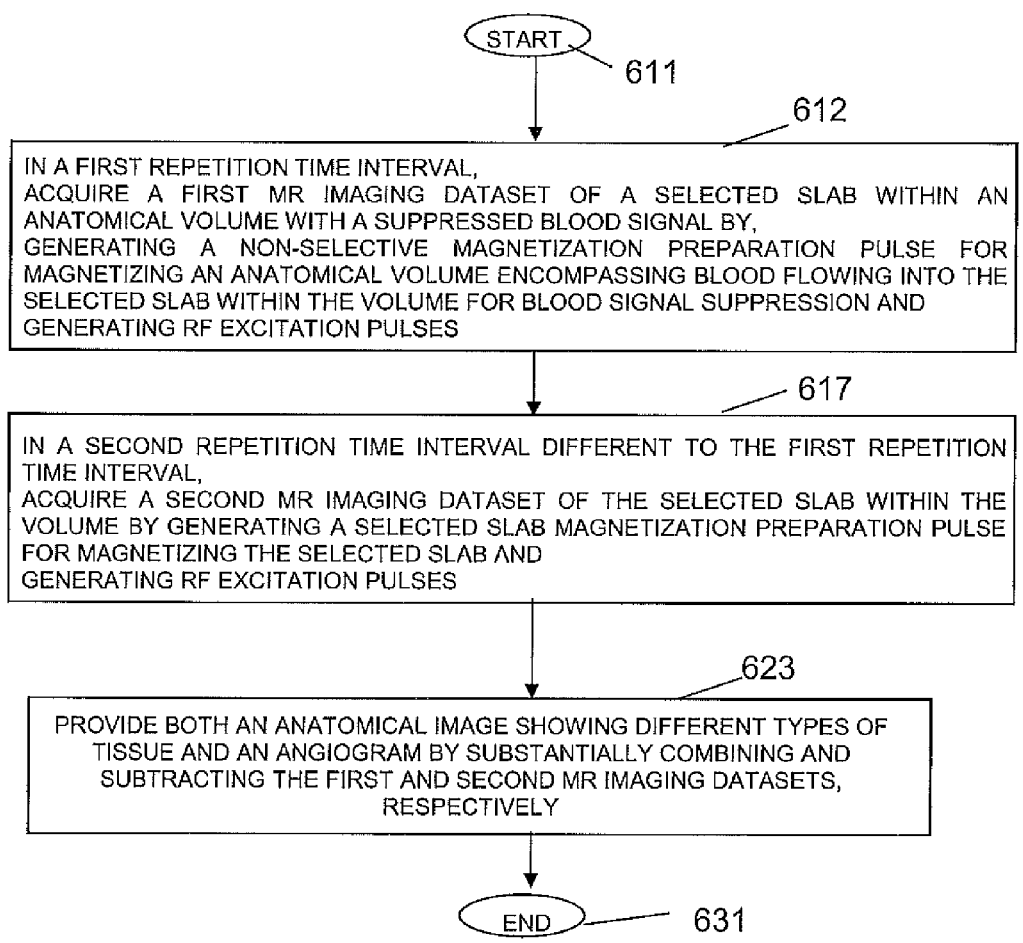
FIG. 6 shows a flowchart of a process performed by an MR imaging system, according to invention principles.

FIG. 6 shows a flowchart of a process performed by an MR imaging system 10 (FIG. 1) for concurrent acquisition of an MR anatomical image of an anatomical region of interest and an MR angiogram image of a vessel structure in the region of interest without the use of a contrast agent. In step 612 following the start at step 611, MR imaging system 10, in a first repetition time interval, acquires a first MR imaging dataset of a selected slab within an anatomical volume with a suppressed blood signal by, generating a non-selective magnetization preparation pulse for magnetizing an anatomical volume encompassing blood flowing into the selected slab within the volume for blood signal suppression and generating RF excitation pulses. In one embodiment, MR imaging system 10 in the first repetition time interval, generates an additional slab selective magnetization preparation pulse for magnetizing the selected slab for blood signal suppression prior to output of the RF excitation pulses.

In step 617 in a second repetition time interval different to the first repetition time interval, MR imaging system 10 acquires a second MR imaging dataset of the selected slab within the volume by generating a selected slab magnetization preparation pulse for magnetizing the selected slab and generating RF excitation pulses. The RF excitation pulses and corresponding data readout acquire the first and second MR imaging datasets comprising at least one of, (a) a Turbo-FLASH pulse sequence, (b) a gradient echo pulse sequence and (c) a Magnetization Prepared Rapid Gradient Echo (MPRAGE) pulse sequence. Also, the RF excitation pulses with RF readout pulses acquire the first and second MR imaging datasets of multiple selected slabs within the volume. In one embodiment, MR imaging system 10 generates a selected magnetization preparation pulse for magnetizing preparation of a specific vessel or vessels, in the second repetition time interval. The magnetization preparation pulse in the first and second repetition time interval comprises an inversion recovery (IR) pulse. Further, the MR imaging system includes, a k-space storage array of individual data elements for storing corresponding individual frequency components comprising the first and second MR imaging datasets, the array of individual data elements having a designated center. The MR imaging system acquires individual frequency components corresponding to individual data elements in the storage array starting at the designated center. MR imaging system 10 acquires a portion less than all of the individual data elements of the k-space storage array to at least one of, (a) reduce image scanning time and (b) alter blood signal level in an image during center of k-space data element acquisition.

In step 623, an image data processor in computer 20 provides both an anatomical image showing different types of tissue and an angiogram by substantially combining and subtracting the first and second MR imaging datasets, respectively. Specifically, the image data processor substantially subtracts imaging data of the first MR imaging dataset from the second MR imaging dataset to provide an image enhancing a vessel structure in the selected slab. The image data processor performs a complex subtraction involving real and imaginary components of the imaging data of the first MR imaging dataset from the second MR imaging dataset. The image data processor combines imaging data of the first MR imaging dataset and the second MR imaging dataset to provide an image in the selected slab including blood and tissue comprising brain tissue including white matter and gray matter. The image data processor combines the imaging data by computing an average of the first MR imaging dataset and the second MR imaging dataset to provide an image of tissue. In one embodiment, MR imaging system 10 interleaves the pulse sequences by successively alternating the pulse sequences of the first and second repetition time intervals. The process of FIG. 6 terminates at step 631.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a user interface processor and enabling user interaction with a processor or other device and associated data acquisition and processing functions.

The UI also includes an executable procedure or executable application. The executable procedure or executable application conditions the user interface processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 1-6 are not exclusive. Other systems and processes may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system concurrently provides both an averaged anatomical T1-weighted image (the MPRAGE showing white matter and gray matter) and a subtracted angiogram by subtracting first and second MR imaging datasets acquired using a non-selective magnetization preparation pulse with a suppressed blood signal and a slab selective magnetization preparation pulse without a suppressed blood signal, respectively enabling typical neurological exams to have a high quality angiogram. Further, the processes and applications may, in alternative embodiments, be located on one or more (e.g., distributed) processing devices on a network linking the units of FIG. 1. Any of the functions, image controls and steps provided in FIGS. 1-6 may be implemented in whole or in part in hardware, software or a combination of both.

What is claimed is:

1. A system for concurrent acquisition of an MR anatomical image of an anatomical region of interest and an MR angiogram image of a vessel structure in the region of interest without the use of a contrast agent, comprising:
   an MR imaging system for,
      in a first repetition time interval,
         generating a non-selective magnetization preparation pulse for magnetizing an anatomical volume encompassing blood flowing into a selected slab within the volume for blood signal suppression,
         generating RF excitation pulses and
         acquiring a first MR imaging dataset of said selected slab within the volume with a suppressed blood signal and
      in a second repetition time interval succeeding said first repetition time interval,
         generating a selected slab magnetization preparation pulse for magnetizing said selected slab,
         generating RF excitation pulses and
         acquiring a second MR imaging dataset of said selected slab within the volume; and
   an image data processor for substantially subtracting imaging data of said first MR imaging data set from said second MR imaging dataset to provide an image enhancing a vessel structure in said selected slab.

2. A system according to claim 1, wherein
said image data processor combines imaging data of said first MR imaging dataset and said second MR imaging dataset to provide an image in said selected slab including blood and tissue.

3. A system according to claim 2, wherein
said tissue comprises brain tissue including white matter and gray matter.

4. A system according to claim 2, wherein
said image data processor combines said imaging data by computing an average of said first MR imaging dataset and said second MR imaging dataset to provide an image of tissue.

5. A system according to claim 4, wherein
said tissue comprises brain tissue including white matter and gray matter.

6. A system according to claim 1, wherein
said RF excitation pulses and corresponding data readout acquire the first and second MR imaging datasets comprises at least one of, (a) a Turbo-FLASH pulse sequence, (b) a gradient echo pulse sequence and (c) a Magnetization Prepared Rapid Gradient Echo (MPRAGE) pulse sequence.

7. A system according to claim 1, wherein
said MR imaging system interleaves the pulse sequences by successively alternating the pulse sequences of the first and second repetition time intervals.

8. A system according to claim 1, wherein
in said first repetition time interval, said MR imaging system generates an additional slab selective magnetization preparation pulse for magnetizing said selected slab for blood signal suppression prior to output of said RF excitation pulses.

9. A system according to claim 1, wherein
said magnetization preparation pulse in the first and second repetition time interval comprises an inversion recovery (IR) pulse.

10. A system according to claim 1, wherein
said MR imaging system includes,
a k-space storage array of individual data elements for storing corresponding individual frequency components comprising the first and second MR imaging datasets, said array of individual data elements having a designated center and
said MR imaging system acquires individual frequency components corresponding to individual data elements in said storage array starting at said designated center.

11. A system according to claim 10, wherein
said MR imaging system acquires a portion less than all of the individual data elements of the k-space storage array to at least one of, (a) reduce image scanning time and (b) alter blood signal level in an image during center of k-space data element acquisition.

12. A system according to claim 1, wherein
said image data processor performs a complex subtraction involving real and imaginary components of the imaging data of said first MR imaging dataset from said second MR imaging dataset.

13. A system according to claim 1, wherein
said RF excitation pulses with RF readout pulses acquire the first and second MR imaging datasets of a plurality of selected slabs within the volume.

14. A system according to claim 1, wherein
a selected magnetization preparation pulse is used for magnetizing preparation of a specific vessel or vessels, in said second repetition time interval.

15. A system for concurrent acquisition of an MR anatomical image of an anatomical region of interest and an MR angiogram image of a vessel structure in the region of interest without the use of a contrast agent, comprising:
an MR imaging system for,
in a first repetition time interval,
acquiring a first MR imaging dataset of a selected slab within an anatomical volume with a suppressed blood signal by,
generating a non-selective magnetization preparation pulse for magnetizing an anatomical volume encompassing blood flowing into said selected slab within the volume for blood signal suppression and
generating RF excitation pulses and
in a second repetition time interval different to said first repetition time interval,
acquiring a second MR imaging dataset of said selected slab within the volume by generating a selected slab magnetization preparation pulse for magnetizing said selected slab and
generating RF excitation pulses; and
an image data processor for providing both an anatomical image showing different types of tissue and an angiogram by substantially combining and subtracting the first and second MR imaging datasets, respectively.

16. A system according to claim 15, wherein
said different types of tissue comprise white matter and gray matter.

17. A system according to claim 15, wherein
said anatomical image showing different types of tissue is generated by averaging the first and second MR imaging datasets.

18. A system according to claim 15, wherein
said angiogram enhances a vessel structure in said selected slab.

19. A method for concurrent acquisition of an MR anatomical image of an anatomical region of interest and an MR angiogram image of a vessel structure in the region of interest without the use of a contrast agent, comprising the activities of:
in a first repetition time interval,
acquiring a first MR imaging dataset of a selected slab within an anatomical volume with a suppressed blood signal by,
generating a non-selective magnetization preparation pulse for magnetizing an anatomical volume encompassing blood flowing into said selected slab within the volume for blood signal suppression and
generating RF excitation pulses and
in a second repetition time interval different to said first repetition time interval,
acquiring a second MR imaging dataset of said selected slab within the volume by generating a selected slab magnetization preparation pulse for magnetizing said selected slab and
generating RF excitation pulses; and
providing an angiogram by substantially subtracting the first and second MR imaging datasets.

20. A method according to claim 19, including the activity of
providing an anatomical image showing different types of tissue by substantially combining the first and second MR imaging datasets.

* * * * *